US009265178B2

(12) United States Patent
Arvelo et al.

(10) Patent No.: US 9,265,178 B2
(45) Date of Patent: Feb. 16, 2016

(54) THERMAL TRANSFER AND COOLANT-COOLED STRUCTURES FACILITATING COOLING OF ELECTRONICS CARD(S)

(71) Applicant: INTERNATIONAL BUSINESS MACHINES CORPORATION, Armonk, NY (US)

(72) Inventors: Amilcar R. Arvelo, Poughkeepsie, NY (US); Levi A. Campbell, Poughkeepsie, NY (US); Michael J. Ellsworth, Jr., Pughkeepsie, NY (US); Eric J. McKeever, Poughkeepsie, NY (US); Richard P. Snider, New Paltz, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 243 days.

(21) Appl. No.: 13/778,552

(22) Filed: Feb. 27, 2013

(65) Prior Publication Data

US 2014/0240930 A1    Aug. 28, 2014

(51) Int. Cl.
*H05K 7/20* (2006.01)
*G06F 1/20* (2006.01)

(52) U.S. Cl.
CPC .......... *H05K 7/2039* (2013.01); *H05K 7/20636* (2013.01); *H05K 7/20772* (2013.01); *Y10T 29/4935* (2015.01)

(58) Field of Classification Search
CPC ..... H05K 7/20; H05K 7/20509; H05K 7/254; G06F 1/20; G06F 2200/201; H01L 23/473; F28F 7/00
USPC .......... 361/679.46, 679.53, 679.54, 698, 699, 361/700–712, 715, 719–724; 165/80.2–80.5, 104.26, 104.33, 185; 174/15.1, 16.3, 252; 62/259.2; 29/890.03, 890.035
See application file for complete search history.

(56) References Cited

U.S. PATENT DOCUMENTS 6,278,611 B1   8/2001   Arena et al.
6,828,675 B2   12/2004  Memory et al.
(Continued)

FOREIGN PATENT DOCUMENTS

CN    201788963 U    4/2011

OTHER PUBLICATIONS

M. David et al., "Thermal Transfer Structures Coupling Electronics Card(s) to Coolant-Cooled Structure(s)", U.S. Appl. No. 13/527,947, filed Jun. 20, 2012.

(Continued)

*Primary Examiner* — Michail V Datskovskiy
(74) *Attorney, Agent, or Firm* — Margaret A. McNamara, Esq.; Kevin P. Radigan, Esq.; Heslin Rothenberg Farley & Mesiti P.C.

(57) ABSTRACT

Cooling apparatuses and coolant-cooled electronic assemblies are provided which include a thermal transfer structure configured to couple to one or more sides of an electronics card having one or more electronic components to be cooled. The thermal transfer structure includes a thermal spreader coupled to the one side of the electronics card, and the apparatus further includes a coolant-cooled structure disposed adjacent to the socket of the electronic system. The coolant-cooled structure includes: one or more low-profile cold rails sized and configured to thermally couple to the thermal spreader along a bottom edge of the thermal spreader with operative docking of the electronics card within the socket; and one or more coolant-carrying channels associated with the low-profile cold rail(s) for removing heat from the low-profile cold rail(s) to coolant flowing through the coolant-carrying channel(s).

15 Claims, 10 Drawing Sheets

(56) References Cited

U.S. PATENT DOCUMENTS

| | | | |
|---|---|---|---|
| 7,151,668 B1* | 12/2006 | Stathakis | 361/700 |
| 7,393,226 B2* | 7/2008 | Clayton et al. | 439/196 |
| 2,004,541 A1 | 11/2009 | Cipolla et al. | |
| 7,724,517 B2 | 5/2010 | Attlesey et al. | |
| 7,965,509 B2 | 6/2011 | Campbell et al. | |
| 7,969,734 B2 | 6/2011 | Arik et al. | |
| 7,969,736 B1* | 6/2011 | Iyengar et al. | 361/699 |
| 8,004,841 B2* | 8/2011 | Cipolla et al. | 361/699 |
| 8,027,162 B2* | 9/2011 | Campbell et al. | 361/699 |
| 8,081,473 B2* | 12/2011 | Cipolla et al. | 361/719 |
| 8,125,780 B2 | 2/2012 | Goth et al. | |
| 8,130,497 B2 | 3/2012 | Kondo et al. | |
| 8,385,067 B2* | 2/2013 | Arvelo et al. | |
| 8,493,738 B2* | 7/2013 | Chainer et al. | 361/700 |
| 8,587,943 B2* | 11/2013 | Barina et al. | 361/699 |
| 8,599,557 B2* | 12/2013 | Peterson et al. | 361/699 |
| 8,625,280 B2* | 1/2014 | Rau et al. | 361/699 |
| 8,638,559 B2* | 1/2014 | Barina et al. | 361/704 |
| 8,649,177 B2 | 2/2014 | Chainer et al. | |
| 8,659,897 B2 | 2/2014 | Meijer et al. | |
| 8,913,384 B2 | 12/2014 | David et al. | |
| 2009/0277616 A1 | 11/2009 | Cipolla et al. | |
| 2010/0085712 A1 | 4/2010 | Hrehor, Jr. et al. | |
| 2010/0091447 A1 | 4/2010 | Jaggers et al. | |
| 2012/0020022 A1* | 1/2012 | Peterson et al. | 361/699 |
| 2012/0026670 A1 | 2/2012 | Rau et al. | |
| 2012/0120605 A1 | 5/2012 | Arvelo et al. | |
| 2012/0279047 A1 | 11/2012 | Chainer et al. | |
| 2013/0120926 A1 | 5/2013 | Barina et al. | |
| 2013/0135812 A1 | 5/2013 | Barina et al. | |
| 2013/0194745 A1 | 8/2013 | Meijer et al. | |
| 2015/0052754 A1 | 2/2015 | Arvelo et al. | |

OTHER PUBLICATIONS

Arvelo et al., Office Action for U.S. Appl. No. 14/528,075, filed Oct. 30, 2014 (U.S. Patent Publication No. 2015/0052754 A1), dated Jun. 15, 2015 (9 pages).

* cited by examiner

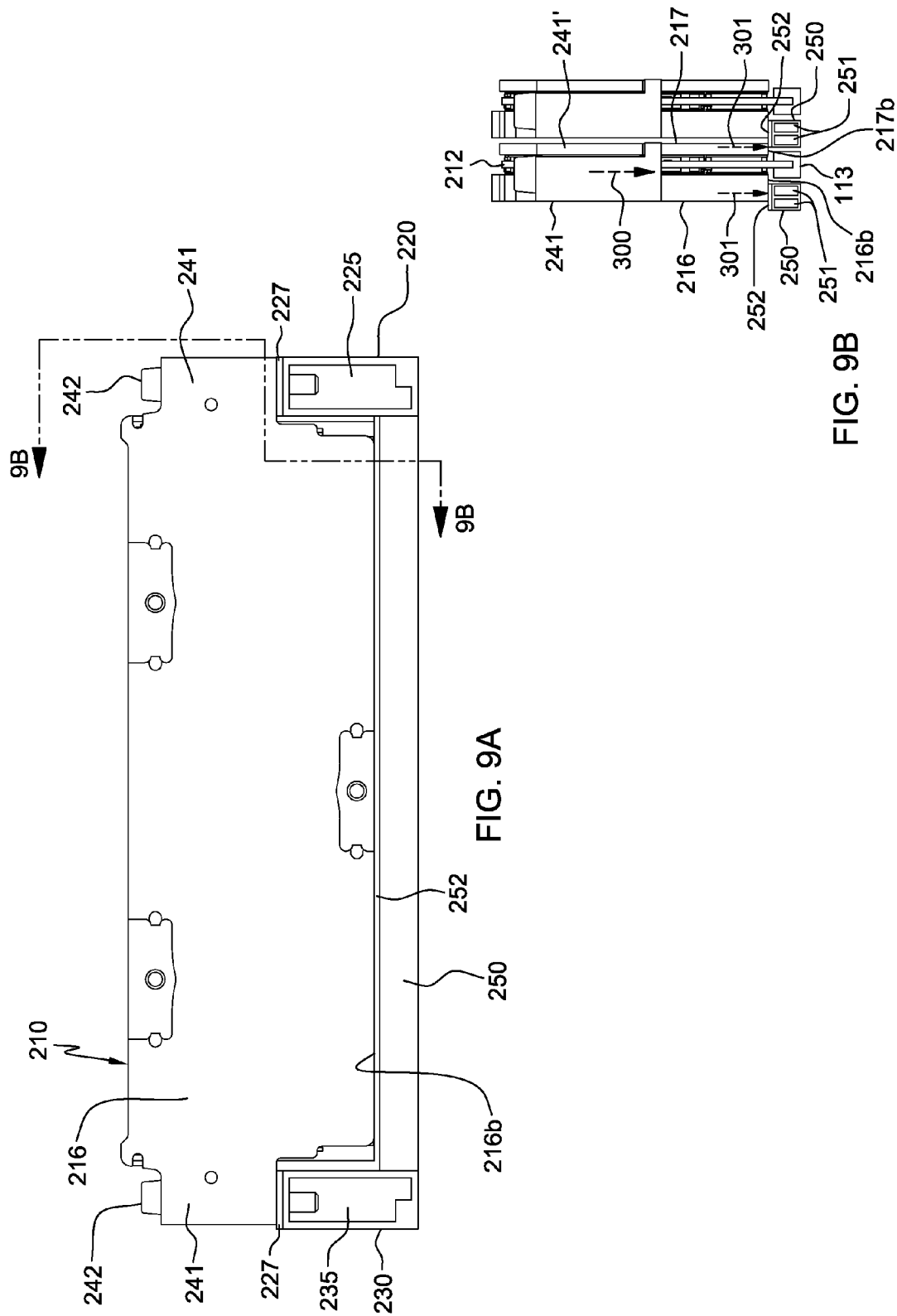

THERMAL TRANSFER AND COOLANT-COOLED STRUCTURES FACILITATING COOLING OF ELECTRONICS CARD(S)

BACKGROUND

As is known, operating electronic components, such as processor modules, produce heat. This heat should be removed from the components in order to maintain device junction temperatures within desirable limits, with failure to remove heat effectively resulting in increased device temperatures, and potentially leading to thermal runaway conditions. Several trends in the electronics industry have combined to increase the importance of thermal management, including heat removal for electronic devices, including technologies where thermal management has traditionally been less of a concern, such as CMOS. In particular, the need for faster and more densely packed circuits has had a direct impact on the importance of thermal management. First, power dissipation, and therefore heat production, increases as device operating frequencies increase. Second, increased operating frequencies may be possible at lower device junction temperatures. Further, as more and more devices are packed onto a single chip, heat flux (Watts/cm$^2$) increases, resulting in the need to remove more power from a given size chip or module. These trends have combined to create applications where it is no longer desirable to remove heat from modern electronic components and electronic systems containing such components, solely by traditional air cooling methods, such as by using air cooled heat sinks with heat pipes or vapor chambers. Such air cooling techniques are inherently limited in their ability to extract heat from electronic components with moderate to high power density.

BRIEF SUMMARY

The shortcomings of the prior art are overcome and additional advantages are provided through the provision, in one aspect, of a cooling apparatus which includes a thermal transfer structure, and a coolant-cooled structure. The thermal transfer structure is coupled to at least one side of an electronics card comprising one or more electronic components to be cooled. The electronics card operatively docks within a socket of an electronic system, and the thermal transfer structure includes a thermal spreader coupled to the one side of the electronics card. The coolant-cooled structure is disposed adjacent to the socket of the electronic system within which the electronics card is to operatively dock, and includes at least one cold rail, and at least one coolant-carrying channel. The at least one side cold rail is sized and configured to thermally couple the thermal spreader along a bottom edge of the thermal spreader with operative docking of the electronics card within the socket. The at least one coolant-carrying channel is associated with the at least one cold rail for removing heat from the at least one cold rail to coolant flowing through the at least one coolant-carrying channel.

In another aspect, a coolant-cooled electronic assembly is provided which includes an electronic system and a cooling apparatus. The electronic system includes an electronics card comprising one or more electronic components to be cooled, and a socket configured to operatively receive the electronics card. The cooling apparatus includes a thermal transfer structure and a coolant-cooled structure. The thermal transfer structure is coupled to at least one side of the electronics card, and includes a thermal spreader. The thermal spreader is coupled to the one side of the electronics card, and the coolant-cooled structure is disposed adjacent to the socket of the electronic system within which the electronics card operatively docks. The coolant-cooled structure includes at least one cold rail and at least one coolant-carrying channel. The at least one cold rail is sized and configured to thermally couple to the thermal spreader along a bottom edge of the thermal spreader with operative docking of the electronics card within the socket, and the at least one coolant-carrying channel is associated with the at least one cold rail for removing heat from the at least one cold rail to coolant flowing through the at least one coolant-carrying channel.

In a further aspect, a method of fabricating a coolant-cooled electronic assembly is provided. The method includes: providing an electronic assembly which includes an electronics card comprising one or more electronic components to be cooled, and a socket configured to operatively receive the electronics card therein; and providing a cooling apparatus to facilitate, at least in part, cooling of the electronics card. Providing of the cooling apparatus includes: coupling a thermal transfer structure to at least one side of the electronics card, wherein the thermal transfer structure includes a thermal spreader coupled to the one side of the electronics card; and disposing a coolant-cooled structure adjacent to the socket of the electronic system within which the electronics card operatively docks. The coolant-cooled structure includes at least one cold rail sized and configured to thermally couple to the thermal spreader along a bottom edge of the thermal spreader with operative docking of the electronics card within the socket, and at least one coolant-carrying channel associated with the at least one cold rail for removing heat from the at least one cold rail to coolant flowing through the at least one coolant-carrying channel.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 9A is a partial cross-sectional elevational view of the cooling apparatus of FIGS. 7A-8, with an electronics card and thermal transfer structure subassembly shown docked in operative position and thermally coupled along multiple surfaces thereof to the coolant-cooled structure of FIGS. 7A & 7B, in accordance with one or more aspects of the present invention; and FIG. 9B is an edge-side, partial cross-sectional elevational view of the cooling apparatus of FIG. 9A, taken along line 9B-9B thereof, in accordance with one or more aspects of the present invention.

DETAILED DESCRIPTION

As used herein, the terms "electronics rack", and "rack unit" are used interchangeably, and unless otherwise specified include any housing, frame, rack, compartment, blade server system, etc., having one or more heat-generating components of a computer system or electronic system, and may be, for example, a stand-alone computer processor having high, mid or low end processing capability. In one embodiment, an electronics rack may comprise a portion of an electronic system, a single electronic system or multiple electronic systems, for example, in one or more sub-housings, blades, books, drawers, nodes, compartments, etc., having one or more heat-generating electronic components disposed therein. An electronic system(s) within an electronics rack may be movable or fixed relative to the electronics rack, with rack-mounted electronic drawers and blades of a blade center system being two examples of electronic systems (or subsystems) of an electronics rack to be cooled.

"Electronic component" refers to any heat-generating electronic component of, for example, a computer system or other electronic system requiring cooling. By way of example, an electronic component may comprise one or more integrated circuit dies, and/or other electronic devices to be cooled, such as one or more electronics cards. In one implementation, an electronics card may comprise a plurality of memory modules (such as one or more electronics cards or dual electronics cards (DIMMs)).

Further, as used herein, the terms "coolant-cooled structure", "coolant-cooled cold plate" and "coolant-cooled cold wall" refer to thermally conductive structures having one or more channels (or passageways) formed therein or passing therethrough, which facilitate the flow of coolant (such as liquid coolant) through the structure. In one example, the channel(s) may be formed by providing tubing extending at least partially through the coolant-cooled structure.

One example of coolant used within the cooling apparatuses and coolant-cooled electronic assemblies disclosed herein is water. However, the concepts presented are readily adapted to use with other types of coolant. For example, the coolant may comprise a brine, a glycol mixture, a fluorocarbon liquid, or other coolant, or refrigerant, while still maintaining the advantages and unique features of the present invention.

Reference is made below to the drawings, which are not drawn to scale for ease of understanding, wherein the same reference numbers used throughout different figures designate the same or similar components. Like numbers with letter suffixes are used to identify similar parts in a single embodiment, and letter suffix "n" is a variable that indicates an unlimited number of similar elements.

Figure 1:
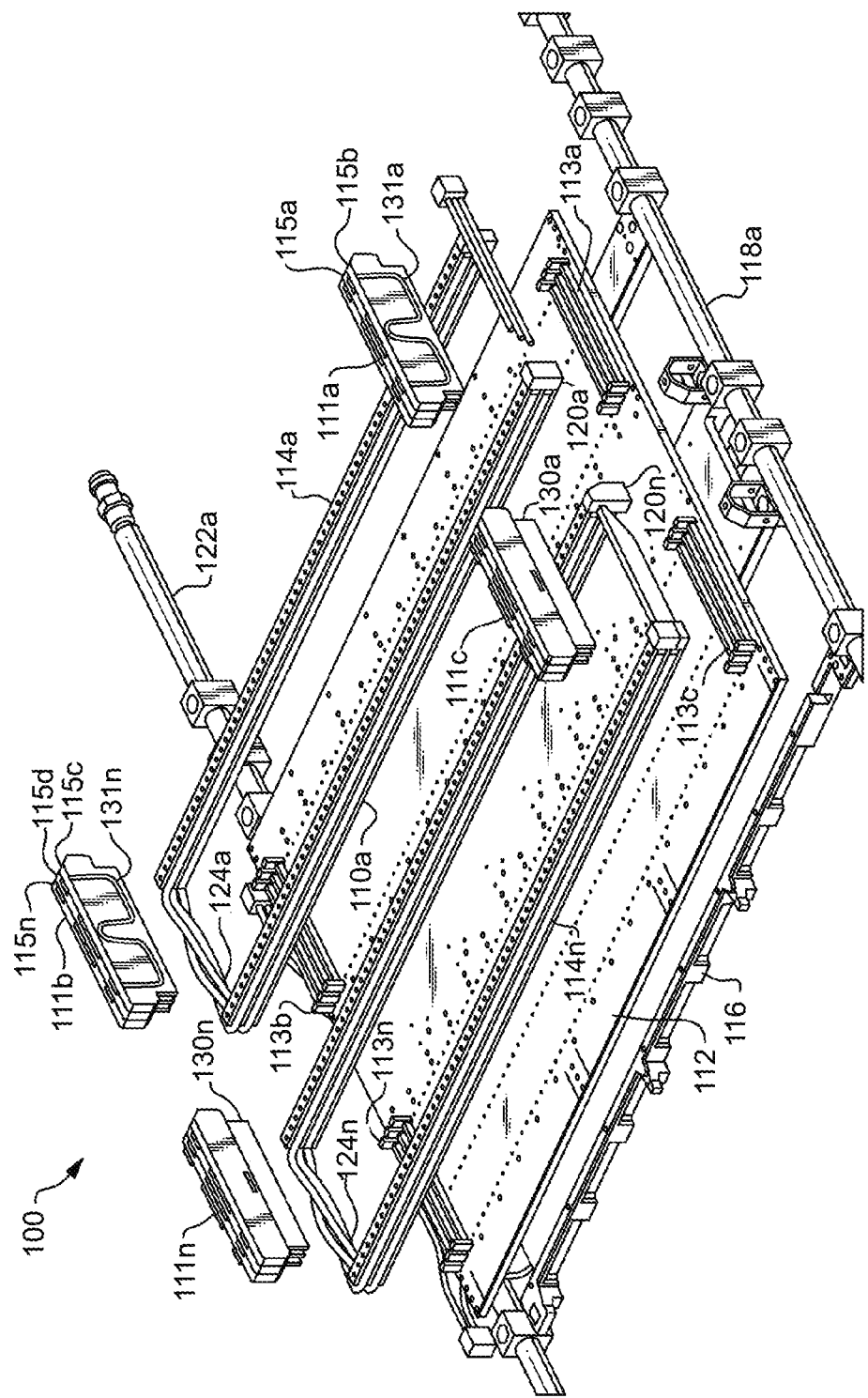
FIG. 1 is an exploded view of one embodiment of a partially-assembled, coolant-cooled electronic assembly comprising a cooling apparatus, in accordance with one or more aspects of the present invention.
Figure 2:
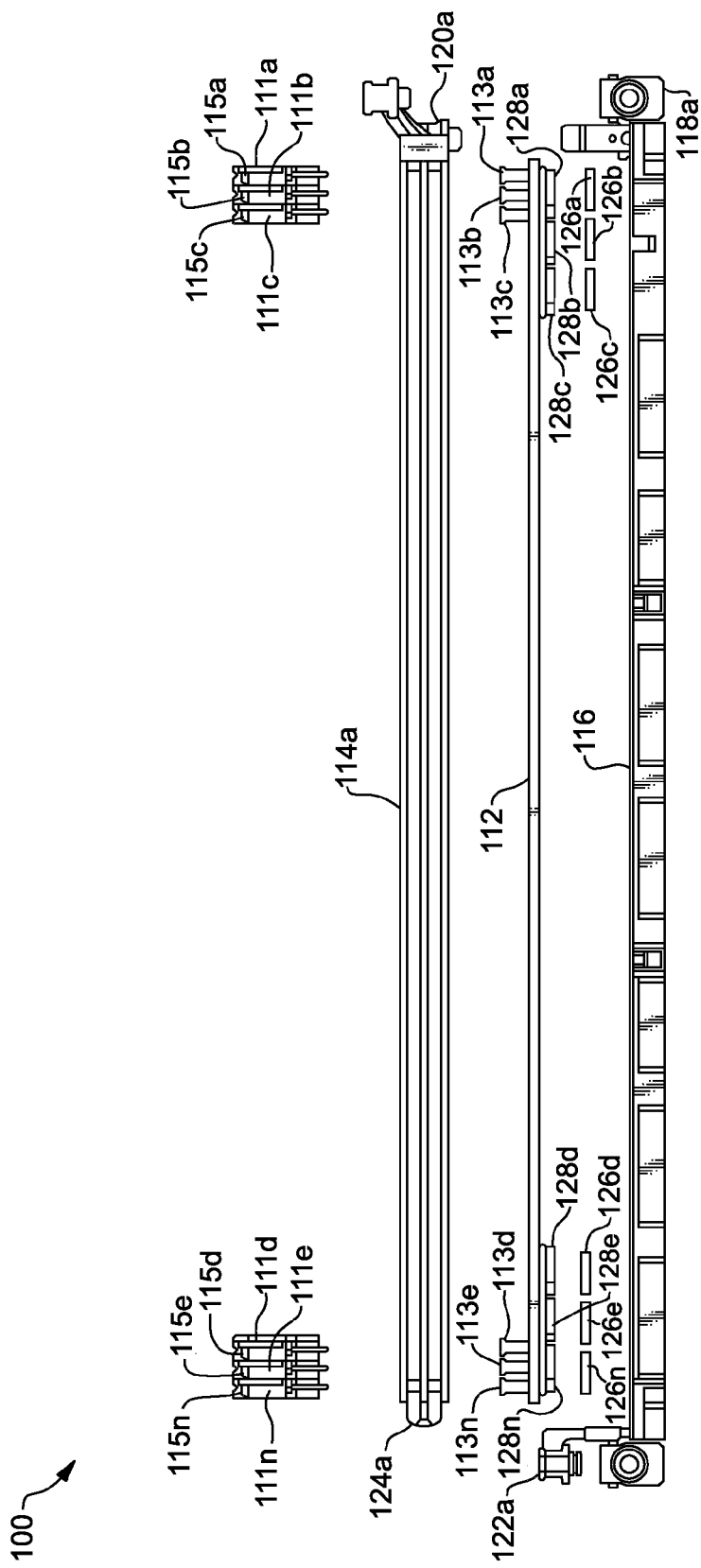
FIG. 2 is an elevational view of the partially-assembled, coolant-cooled electronic assembly of FIG. 1, in accordance with one or more aspects of the present invention.

With reference now to FIGS. 1 and 2, a cooling apparatus 100 to remove heat from one or more electronics cards or electronics card assemblies 111a-111n, and/or a circuit board 112 is initially described. In one embodiment, cooling apparatus 100 includes a cold rail 114a-114n disposed to engage each end of electronics card assemblies 111a-111n adjacent to where the cards are attachable to respective sockets (or connectors) 113a-113n coupled to circuit board 112. The cold rails 114a-114n remove heat from the electronics cards or electronics card assemblies 111a-111n. The cooling apparatus 100 may also include a cold plate 116 connected to the cold rails 114a-114n, with circuit board 112 being disposed between the cold plate and the cold rail.

In one embodiment, the cold rails 114a-114n and cold plate 116 each, or in combination, comprise an enclosed fluid pathway. In another embodiment, the cold rails 114a-114n are attachable to the circuit board 112 to aid in removing heat from the circuit board.

In a particular configuration, one side of cold rails 114a-114n is connected to a respective supply manifold 118a, another side of the cold rails 114a-114n is connected to one side of the cold plate 116 at outlets 120a-120n, and another side of the cold plate 116 is connected to a return manifold 122a. The cooling apparatus 100 may additional include cross-over tubing 124a-124n between the one side of the cold rails 114a-114n that connects to the supply manifold 118a-118n and the other side of the cold rail that connects to the cold plate 116, thereby improving heat transfer out of the electronics card assemblies 111a-111n.

In an embodiment, cooling apparatus 100 also includes thermal interface material 126a-126n adjoining cold plate 116 and components 128a-128n (e.g., electronic components carried by circuit board 112), the cold rail 114a-114n, and/or the circuit board 112. In some embodiments, the electronics card assemblies 111a-111n comprise a plurality of electronics cards that are too closely positioned for an intervening cold rail 114a-114n to fit in between any two adjacent electronics cards. Further, the electronics card assemblies 111a-111n may have no space opposite the side that is attachable to the circuit board 112 for any intervening cold rail 114a-114n or cold plate 116 to be installed.

In one embodiment, the cold rails 114a-114n engage each end of the electronics card assemblies 111a-111n with a removable fastener 115a-115n. Furthermore, the cold plate 116 may act as a circuit board 112 stiffener.

In one embodiment, cooling apparatus 100 includes cold rails 114a-114n which engage each end of electronics card assemblies 111a-111n adjacent where the cards are attachable to circuit board 112, such that the cold rails remove heat from the electronics cards. The cold rails may engage each end of the electronics card assemblies via removable fasteners 115a-115n.

In one embodiment, cooling apparatus 100 includes a cold rail 114a-114n to engage each end of electronics card assemblies 111a-111n adjacent to where the electronics cards are attachable to circuit board 112, the cold rail to remove heat from the electronics card, and the cold rail comprises an enclosed fluid pathway. The cooling apparatus 100 also includes cold plate 116 connected to the cold rail 114a-114n with the circuit board 112 between the cold plate and the cold rail, the cold plate to remove heat from the circuit board, and the cold plate comprises an enclosed fluid pathway. The cooling apparatus 100 further includes one side of the cold rail 114a-114n that connects to a supply manifold 118a-118n, another side of the cold rail that connects to one side of the cold plate 116, and another side of the cold plate that connect to a return manifold 122a-122n.

In view of the foregoing, the cooling apparatus 100 aids in cooing electronics cards 111a-111n and/or circuit board 112. As a result, the apparatus removes heat from electronics card assemblies 111a-111n, which may comprise in-line memory modules or dual-in-line memory modules (DIMMs), where packaging density prohibits air-cooling and there is inadequate space between or above the cards for cold plates, as well as removes heat from the printed circuit board 112 that is unable to be air-cooled.

In one embodiment, the cooling apparatus 100 includes two cold rails 114a-114n that efficiently remove heat from the ends of the electronics card assemblies 111a-111n packages. The cold rails 114a-114n reduce temperature variations from coolant-heating effects between the electronics card assembly 111a-111n sites and enable extreme electronics card package density. In addition, the cold rails 114a-114n remove heat generated by current flowing through the printed circuit board 112 that the electronics card assemblies 111a-111n are plugged into.

For example, a high-performance electronics card 111a-111n package can be designed to effectively move its heat to each end of the card (e.g., DIMM) by thermal conduction assisted with heat pipe 131a-131n technology. The cooling apparatus 100 provides optimized design concepts for cold rails 114a-114n at the ends of these card assemblies 111a-111n for heat removal to water or other liquid coolant.

Cooling apparatus 100 may use, for instance, machined and brazed copper construction, and/or use rectangular aluminum rails with embedded copper tubes, by way of example only. While copper cold rails 114a-114n provide improved thermal performance, an aluminum solution offers weight, cost, and reduced risk of braze joint leaking advantages. The cooling apparatus 100 provides high uniform cooling between the electronics card assembly 111a-111n sites.

Another feature of the cold rails 114a-114n is that they can cool the electronics card assemblies 111a-111n through one or more surfaces, and use another surface to cool the printed circuit board 112 that the DIMMs, processors, and other electronic components are mounted on. A suitable electrical insulator yet thermal conductor, e.g., thermal interface material (TIM), is placed between the cold rails 114a-114n and printed circuit board 112.

Another feature of the cooling apparatus 100 is it enables effective field-servicing of individual electronics cards 111a-111n for either repair or upgrade. This is achieved via, for example, threaded fasteners 115a-115n, between the electronics card assembly 111a-111n packages and the top thermal surface of cold rails 114a-114n with an aluminized indium interface material between them to ensure the TIM stays with the electronics card assemblies 111a-111n.

Figure 5:
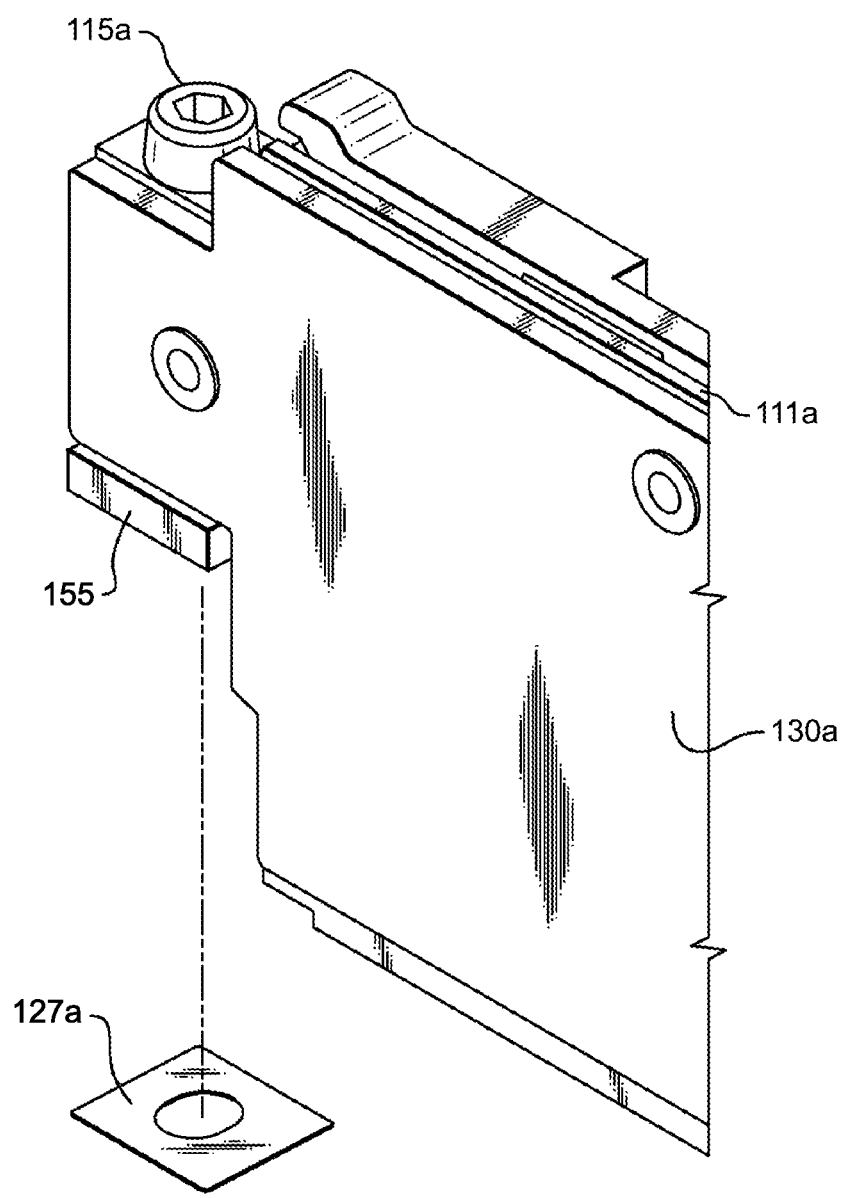
FIG. 5 depicts an example arrangement of a thermal interface material at one end of a thermal spreader of a thermal transfer structure coupled to an electronics card, in accordance with one or more aspects of the present invention.

FIG. 5 illustrates an example arrangement, wherein the mechanical features in thermal interface material 127a of thermally conductive extension 155 and pressure are used to keep the indium with the electronics card assembly 111a while handling. In this embodiment, the aluminum (non-sticking) side of the TIM 126a is facing down to cold rail 114a (see FIG. 1) such that any sticking causes further adherence to electronics card assembly 111a and not to the cold rail 114a. With the TIMs in place and cards or DIMMs attached, the height of the cold rails for card cooling is such that the electronics card power and signal connectors are properly engaged to board connector.

Figure 3A:
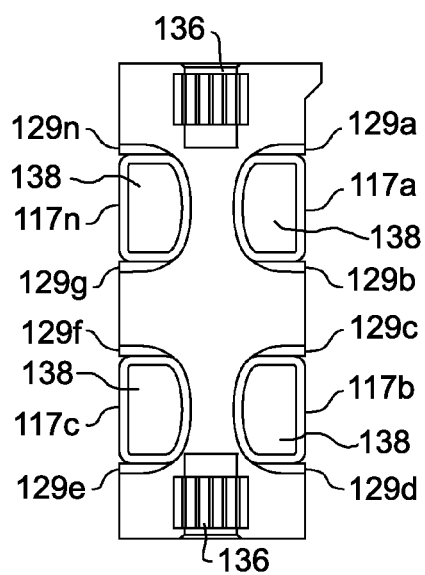
FIGS. 3A & 3B depict threaded openings and fasteners for facilitating attaching of electronics cards from one side, and attaching of a circuit board assembly from the other side, in accordance with one or more aspects of the present invention.
Figure 3B:
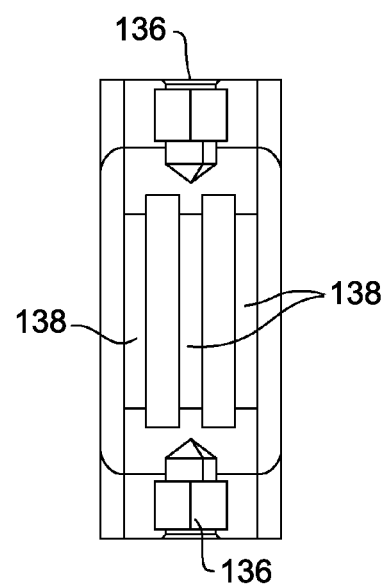

FIGS. 3A & 3B depict openings with threads or threaded inserts 136 for attaching the electronics card assemblies 111a-111n from one side and attachment to printed circuit board 112 assembly from the other side. In FIG. 3A, when the cold rails 114a-114n are coupled with a patterned indium or other suitable dry interface on the electronics card assemblies 111a-111n side and an electrical insulator, thermal conductor on the board side 112, heat from both upper and lower sides of cold rails 114a-114n is transferred by conduction to the cold rails, across the thermal epoxy (or solder interface) 129a-129n and the cold rail copper tubes with "D" shape 117a-117n, and finally convected to the coolant fluid 138. Similarly, in FIG. 3B, heat from both upper and lower sides of cold rails 114a-114n is transferred by conduction to the cold rails 114a-114n and convected to the coolant fluid 138.

One goal of electronics card assembly 111a-111n cooling is to make each card site have as equal cooling/temperature as possible. This is achieved by running the inlet coolant (e.g., water), first down one cold rail 114a-114n then back the other cold rail cooling the same set of electronics card assemblies 111a-111n. In this manner, every card attachment site between the two cold rails has same average coolant temperature. Coolant within cold rails 114a-114n may then be used to cool components 128a-128a such as voltage transformation modules ("VTMs") and/or the like which are tolerant of higher coolant temperatures, after which the coolant exits to be cooled externally.

Figure 4:
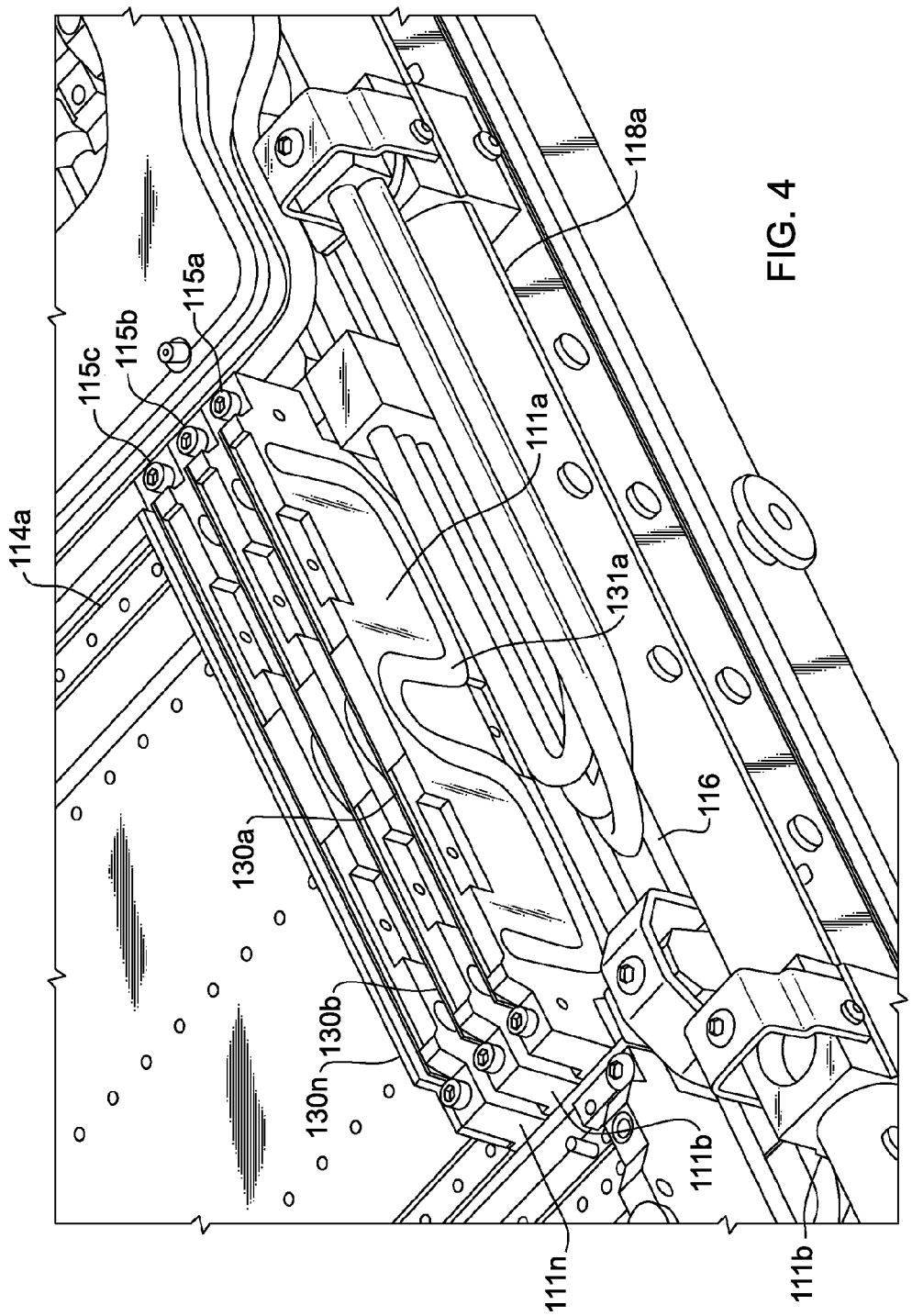
FIG. 4 depicts one embodiment of multiple thermal transfer structures coupled to electronics cards operatively disposed within the electronic system, in accordance with one or more aspects of the present invention.

FIG. 4 shows multiple electronics card assemblies 111a-111n threaded 115a-115n to cold rails 114a-114n. FIG. 4 also shows the coolant feed from a main rack manifold to cold rail 114a-114n using multiple tubes. Heat dissipated across the electronics card assemblies 111a-111n is conducted to each end of the assembly via conduction in heat spreaders, such as aluminum or copper spreaders and (in one embodiment) with the help of heat pipes 131a-131n. In another embodiment, the electronics card assemblies 111a-111n transfer heat from, for instance, memory modules of the cards through conduction using, for example, heat spreader 130a-130n and/or the like.

In one embodiment, the cold rails 114a-114n remove heat from electronics card assemblies 111a-111n thermally and mechanically attached thereto from above and from the printed circuit board 112 below. As noted, in another embodiment, the cold rail 114a-114n assembly functions to remove heat from the series of electronics card assemblies 111a-111n, where the heat of the DRAMs, ASICs, and other heat-generating parts of the electronics cards is conducted through appropriate TIMs via conductive heat spreaders 130a-130n, for instance, made of aluminum or copper, and which may include heat pipes 131a-131n or vapor chambers to facilitate heat transfer to the electronics card assembly 111a-111n ends or edges.

In one embodiment, cold rail 114a-114n that has a multitude of electronics card assemblies 111a-111n attached to it through threaded connector 115a-115n connections at each end of the assemblies' heat spreaders 130a-130n. The connectors 115a-115n mate with appropriately-spaced, threaded openings in the cold rails 114a-114n upper surface.

In one embodiment, the cold plate 116 and/or cold rail 114a-114n uses, for instance, a patterned indium or an aluminized patterned indium as the thermal interface material between the electronics card assembly 111a-111n heat spreaders and the cold plate 116 thermal conduction surface. The patterned indium is attached to the thermal spreader and is non-sticking to the colder cold plate 116 as the aluminized side faces the cold plate. This thermal path may be validated prior to applying full power to the electronics cards by monitoring thermal sensors located at hotspots within the electronics card assembly.

In one embodiment, the cold plate 116 and/or cold rail 114a-114n and electronics cards 111a-111n assembly allows for easy removal and addition of electronics cards at the factory or the customer location without moving the cold plate or breaking any coolant connections. In another embodiment, the cold plate 116 and/or cold rail 114a-114n assembly enables the inlet coolant to proceed down one side of the electronics card assemblies 111a-111n and then cross over to a second leg of the cold plate or cold rail and proceed in the reverse direction with respect to where the coolant passes by each electronics card. In this manner each electronics card assembly 111a-111n site is in a direct thermal conduction path with the same average water temperature by taking the average of the water at both ends of the electronics card, thereby improving electronics card site temperature uniformity.

In one embodiment, the cold plate 116 and/or cold rail 114a-114n assembly is constructed of copper where the coolant passes in three parallel channels in each of two legs of the cold plate assembly. This construction can be made, for instance, by machining and brazing copper plates. In another embodiment, the cold plate 116 assembly includes two legs of the cold plate interconnected in a means that mixes the water together as it is transferred from the upstream cold rail 114a-114n to the downstream cold rail.

In one embodiment, the cold plate 116 and/or cold rail 114a-114n assembly includes four copper tubes that are thermally and/or mechanically attached to an aluminum base section either with braze, solder, or with a thermal epoxy. In another embodiment, the cold plate 116 assembly includes four copper tubes in each leg of the aluminum base cold rail 114a-114n that are twisted in such a manner that the tubes that are in the upper half of the upstream cold rail are brazed to the copper tubes in the lower half of the downstream cold rail. This creates better overall electronics card 111a-111n cooling as more heat is removed from the electronics cards than from the printed circuit board 112.

In one embodiment, cold plate 116 also provides a circuit board 112 stiffener that is designed to cool Voltage Transformer Modules (VTMs) and similar power conversion devices that are soldered to the backside of a printed circuit board that has memory, processors, and other logic components on its front side. This cold plate 116 acts as a circuit board stiffener 112 and conducts heat from where it contacts the printed circuit board to the coolant tubes in the cold plate 116 of the assembly.

In one embodiment, the cold plate 116 is constructed of high-thermal-conductivity aluminum and copper tubes carrying coolant running over the region of the board where the VTMs are located. These tubes are located on the side opposite of the thermal surface closest to the VTMs to enable special surface treatments of the aluminum thermal surface. In another embodiment, the cold plate 116 has its thermal surface area directly above the VTMs roughened to between an N7 and N9 for long-term stability of the TIM material to counteract when the printed circuit board 112 and the cold plate expand and contract at different rates causing relative motion in the gap between the VTMs and the mating cold plate surface.

In another embodiment, the cold plate 116 uses a TIM material 126a-126n between the VTMs and the cold plate thermal surface that has been suitably roughened. The TIM material 126a-126n will be of sufficient elasticity to allow for compression without harming the VTMs, such as a fully-cured thermal gel. In another embodiment, the cold plate is assembled to the printed circuit board 112 at a slow enough strain rate that the compression of the TIM material 126a-126n does not produce damaging stresses to the VTMs at worst case tolerances.

In one embodiment, the cold plate 116 is designed to contact the backside of the printed circuit board 112 where VTMs are not located for purposes of providing board rigidity for plugging land grid array ("LGA") loaded modules and electronics cards 111a-111n. A suitable thin electrical insulator may be used as the interface between the printed circuit board 112 and the cold plate 116. In another embodiment, the cold plate 116 is designed to conduct heat from the printed circuit board 112 it is in mechanical contact with, especially in areas between the VTMs and processor modules where currents are highest in the board and associated resistance heating is high.

In one embodiment, the cooling apparatus 100 uses an inlet manifold feeding chilled water to multiple cold rails 114a-114n for electronics card 111a-111n cooling. The outlet water from the electronics card 111a-111n cold rails 114a-114n then feeds cold plate 116 for cooling VTMs and similar devices that are located on the reverse side of the circuit board 112 from the electronics card and other logic components. The cooling apparatus 100 also includes an outlet manifold that connects tubes from the VTM cold plate 116 outlet and returns the warmed water to be chilled outside of the drawer.

In one embodiment, the cooling apparatus 100 provides lower water temperature for cooling for the electronics card assemblies 111a-111n, then uses the warmed exit water from the card cooling to cool the less-sensitive power components. In another embodiment, the cold plate 116 assembly removes IIR resistive loses from both sides of the printed circuit board 112 enabling high board currents that cannot be air-cooled.

In another embodiment, the cooling apparatus 100 comprises an assembly that requires only one feed and one return manifold connection while cooling components on each side of printed circuit board 112. In another embodiment, the cooling apparatus 100 provides circuit board 112 rigidity for plugging and mechanically locating electronics cards 111a-111n at a proper height in the connectors 113a-113n.

Figure 6:
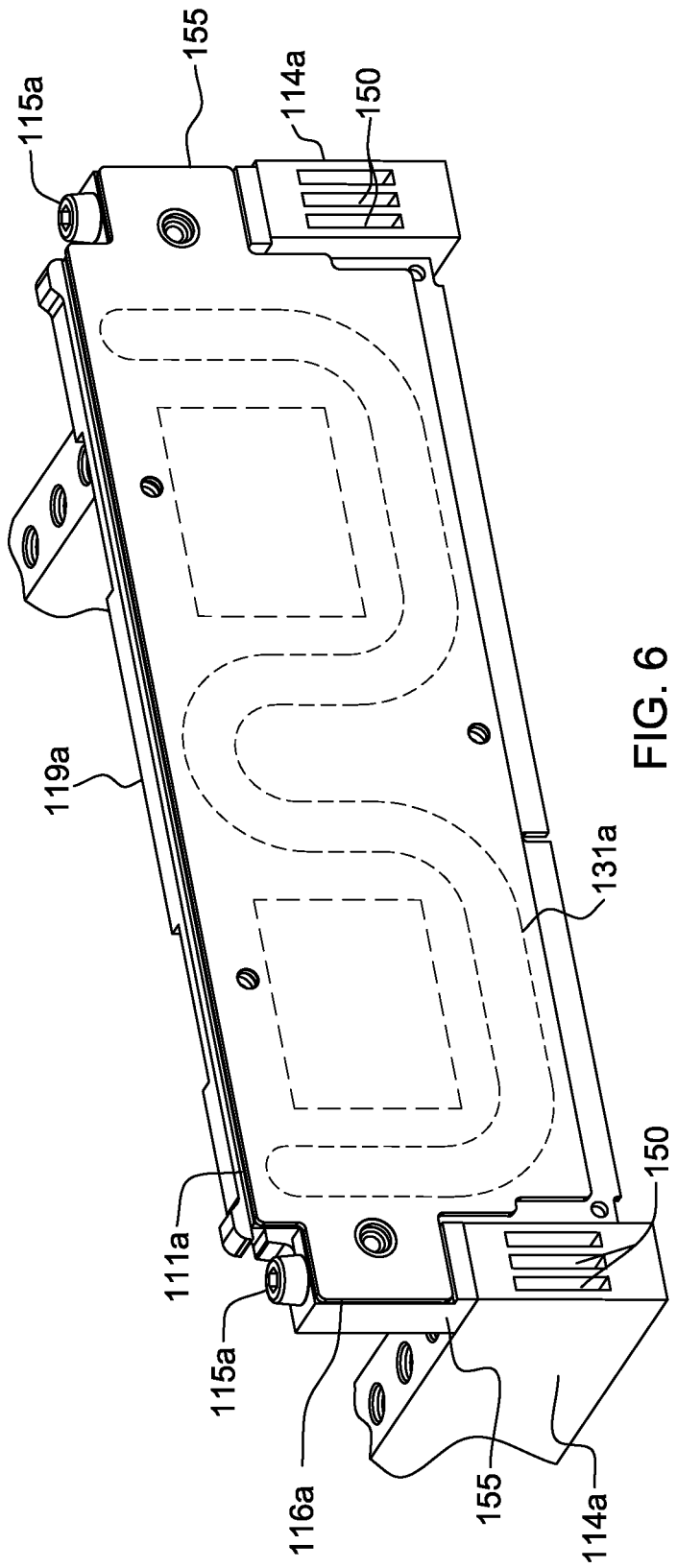
FIG. 6 is a cross-sectional elevational view of one embodiment of a thermal transfer structure and coolant-cooled cold rails of one embodiment of a cooling apparatus, in accordance with one or more aspects of the present invention.

By way of further example, FIG. 6 depicts a cross-sectional elevational view of one embodiment of an electronics card assembly 111a mounted to two parallel cold rails 114a to facilitate thermal conduction of heat from electronics card assembly 111a, through the assembly's heat spreader 116a and the thermally conductive extensions 155 thereof, to cold rails 114a disposed at opposite side ends or edges of the electronics card assembly, as illustrated. A heat pipe 131a within heat spreader 119a coupled to one side of the electronics card facilitates transfer of heat to the opposite edges thereof, and in particular to the thermally conductive extensions 155. The thermally conductive extensions 155 are coupled via, for instance, fasteners 115a to, in this embodiment, the upper surfaces of cold rails 114a. As illustrated, in one embodiment, cold rails 114a include a plurality of coolant-carrying channels 150. Cold rails 114a are configured to convect heat to coolant flowing through the coolant-carrying channels 150 for transfer away from the electronics card and heat spreader subassembly.

In one embodiment, heat pipe 131a embedded within heat spreader 119a is a copper heat pipe which is configured to reduce the thermal spreading resistance of the heat spreader.

Heat dissipated by the electronics card components is conducted to opposing ends of the assembly and down to cold rails 114a. An indium thermal interface material may be employed between the heat spreaders and cold rails to facilitate thermal conduction of heat into the cold rails.

The above-discussed solutions are advantageous for, for instance, electronics card implementations with heat dissipations of (for example) approximately 50 watts each or less. Future electronic system implementations may utilize the electronics cards which dissipate heat closer to or in excess of 100 watts each. For such an implementation, an enhanced liquid-cooling approach is believed to be advantageous, including one that further facilitates heat removal from the underlying circuit board upon which the electronics card sockets (e.g., DIMM sockets) are mounted.

Disclosed hereinbelow with reference to FIGS. 7A-9B are enhanced cooling apparatuses, coolant-cooled electronic assemblies, and methods of fabrication thereof, which efficiently transfer heat from electronics cards, such as from electronic components on the cards, including DRAMs, ASICs, and other heat sources. In one embodiment, the electronics card may be an in-line memory module card or a dual-in-line memory (DIMM) card, and heat is transferred via a thermal transfer structure. Multi-surface cooling is facilitated by reconfiguring the coolant-cooled structure of FIGS. 1-6 to include a plurality of secondary, low-profile cold rails coupled in fluid communication between two primary, parallel-extending cold rails. The plurality of secondary, low-profile cold rails extending between the two primary cold rails are spaced apart such that the plurality of electronics card-receiving sockets are disposed between adjacent secondary, low-profile cold rails, as described further herein. The low-profile cold rails are configured and disposed to thermally contact the respective thermal transfer structures comprising, for instance, a thermal spreader of the thermal transfer structure, when the electronics card is operatively docked in an adjacent socket. This thermal coupling occurs along a bottom edge of the thermal transfer structure, and is in addition to thermal coupling along the side edges of the thermal transfer structure to the two primary, edge-side cold rails.

Generally stated, described herein with reference to the embodiments of FIGS. 7A-9B are cooling apparatuses implementing active cooling approaches for increased cooling efficiency. These cooling apparatuses are particularly advantageous for use with electronics cards, such as in-line memory module cards or DIMM cards, designed to be closely spaced when operatively positioned within an electronic system, such as a central processor complex (CPC) or central electronic complex (CEC) (as described above in connection with the embodiment of FIGS. 1-6). The cooling apparatus includes, for instance, a thermal transfer structure, and a coolant-cooled structure. The thermal transfer structure is coupled to at least one side of an electronics card comprising one or more electronic components to be cooled, and the electronics card operatively docks within a socket of the electronic system, and the thermal transfer structure includes, at least in part, a thermal spreader coupled to the one side of the electronics card. The coolant-cooled structure is disposed adjacent to the socket of the electronic system within which the electronics card operatively docks, and includes, at least in part, at least one cold rail sized and configured to thermally couple to the thermal spreader along a lower portion of the thermal spreader, such as a bottom edge of the thermal spreader, with operative docking of the electronics card within the socket, and at least one coolant-carrying channel associated with the at least one cold rail for removing heat from the at least one cold rail to coolant flowing through the at least one coolant-carrying channel.

In one embodiment, the at least one cold rail includes at least one low-profile cold rail that is disposed adjacent to, and extends in spaced relation to, a main side of the socket. The coolant-cooled structure further includes, by way of example only, first and second primary, parallel-extending cold rails at the edges of the socket (or plurality of sockets), as well as at the side edges of the thermal transfer structures when the electronics card(s) is operatively docked within the socket(s). These primary, parallel-extending cold rails are also referred to herein as edge-side cold rails, and are sized and configured to thermally couple to respective side edges of, for instance, the thermal spreader with operative docking of the electronics card within the socket. Note that as used herein, the phrase "cold rail" refers to a thermally conductive structure which has the noted one or more coolant-carrying channels associated therewith. In one implementation, the one or more coolant-carrying channels are disposed within the cold rail itself, and heat is transferred from the cold rail to coolant flowing through the associated coolant-carrying channel(s).

In one embodiment, a first primary (or edge-side) cold rail includes a coolant supply manifold, the second primary (or edge-side) cold rail includes a coolant return manifold, and the plurality of low-profile cold rails coupled in parallel between the first and second edge-side cold rails are coupled in fluid communication between the coolant supply manifold of the first edge-side cold rail and the coolant return manifold of the second edge-side cold rail to facilitate flow of coolant through the coolant-carrying channels associated with the plurality of low-profile cold rails. As explained further herein, in one embodiment, a plurality of sockets are disposed on a circuit board in spaced parallel relation to each other, with the plurality of low-profile cold rails of the coolant-cooled structure disclosed herein disposed interleaved with the plurality of sockets. With operative docking of an electronics card within a respective socket, the associated thermal transfer structure attached to the card thermally couples to the first and second edge-side cold rails, as well as to at least one low-profile cold rail disposed adjacent to the socket. Together, significantly greater surface area is provided in the coolant-cooled structure embodiment disclosed herein, that is, in comparison to (for example) the coolant-cooled structure illustrated in FIGS. 1-6, and described above.

In one implementation, the thermal transfer structure includes a first, front thermal spreader, and a second, back thermal spreader, which couple together with the electronics card disposed therebetween such that the electronics card is sandwiched between the front and back thermal spreaders. With docking of the electronics card into a respective socket, the first, front thermal spreader thermally couples to a first low-profile cold rail along a bottom surface of the first, front side thermal spreader, and the second, back thermal spreader thermally couples to a second low-profile cold rail along a bottom surface of the second, back thermal spreader.

Further, in another embodiment, a single low-profile cold rail is shared, that is, thermally coupled to, by different thermal spreaders, such as a front thermal spreader and a back thermal spreader of two different thermal transfer structures thermally coupled to two electronics cards docked in adjacent sockets mounted to the circuit board.

As in the embodiments discussed above, a compliant thermal interface material may be disposed between the thermal spreader(s) and an upper surface of a low-profile cold rail to which (in one embodiment) the bottom surface of the thermal spreader(s) thermally couples with operative docking of the associated electronics card within the respective socket. As one example, the front thermal spreader of a first thermal transfer structure may thermally couple to a majority of the upper surface of a low-profile cold rail, and the back thermal spreader of an adjacent thermal transfer structure may partially thermally couple to the upper surface of that low-profile cold rail as well. This example assumes that the front thermal spreader is dissipating a greater amount of heat than the back thermal spreader, which would be dependent on the particular electronics card configuration. In the example provided herein, it is assumed that the front side of the electronics card dissipates a greater amount of heat than the back side of the electronics card (by way of example only).

Figure 7A:
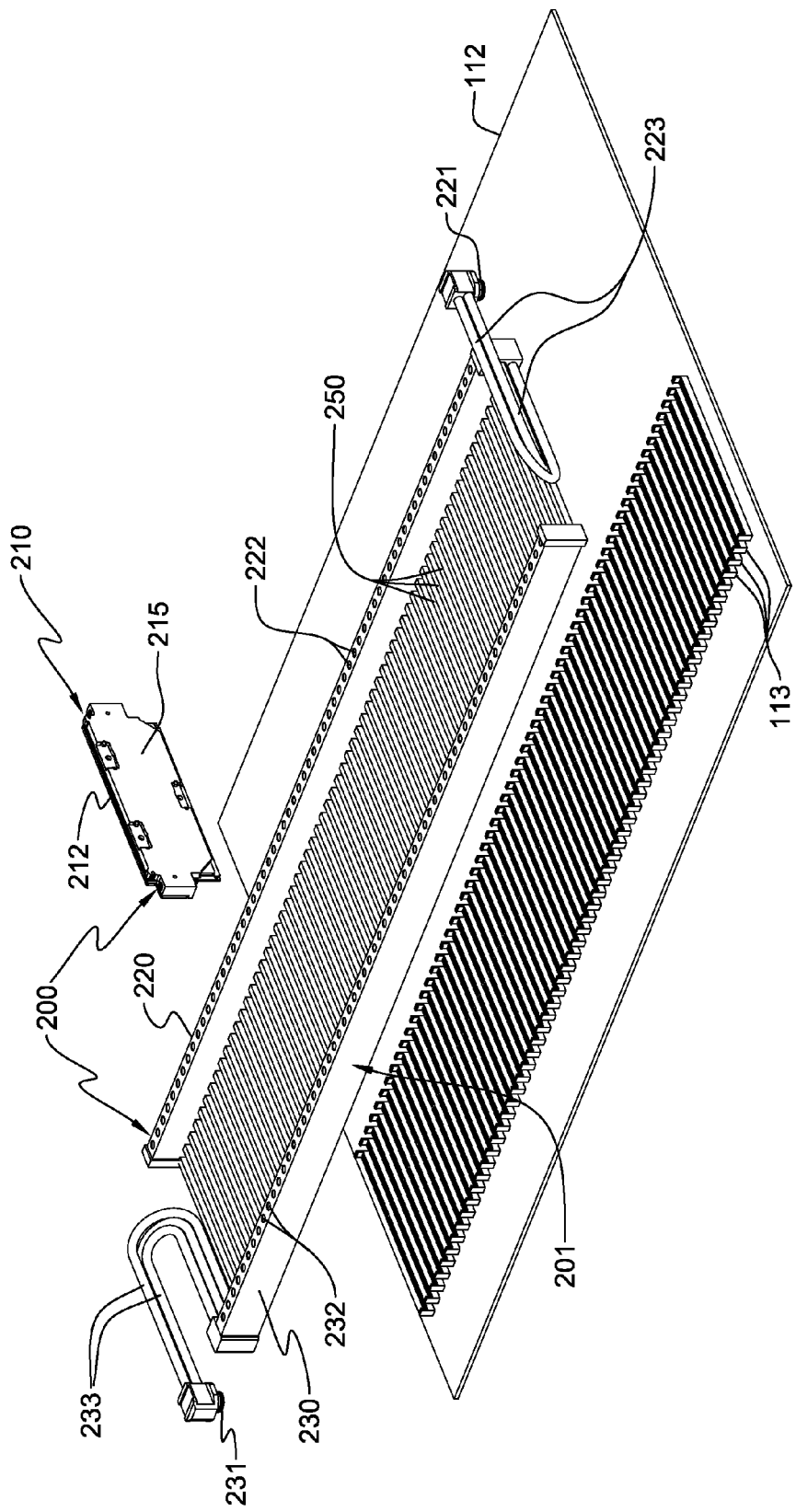
FIG. 7A is a partially exploded depiction of another embodiment of a cooling apparatus, wherein a thermal transfer structure is shown coupled to an electronics card, and exploded from an alternate embodiment of a coolant-cooled structure, in accordance with one or more aspects of the present invention.
Figure 7B:
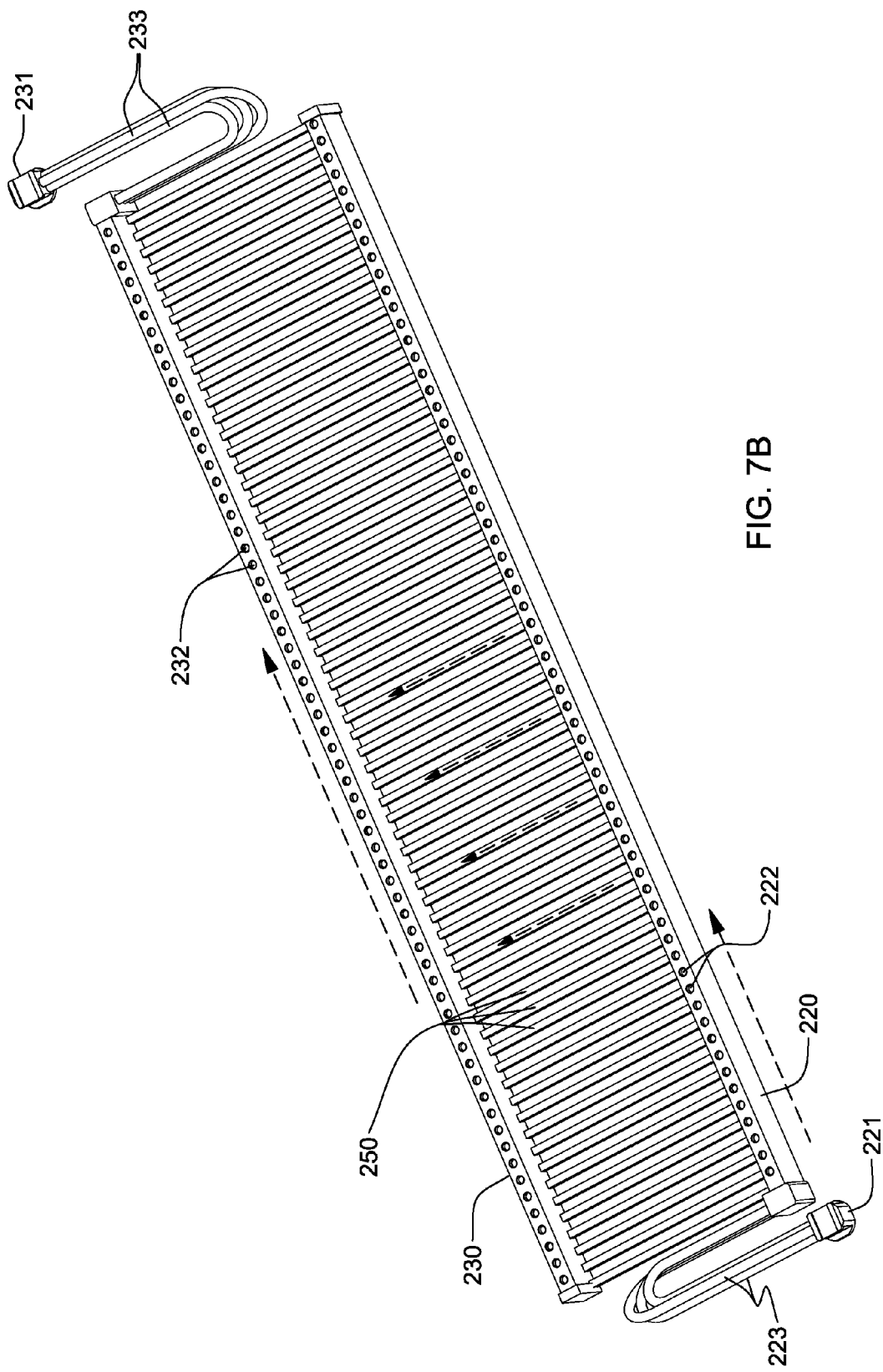
FIG. 7B is an enlarged depiction of the coolant-cooled structure of the cooling apparatus of FIG. 7A, in accordance with one or more aspects of the present invention.

FIGS. 7A & 7B depict one embodiment of a cooling apparatus, generally denoted 200, in accordance with one or more aspects of the present invention. As illustrated, an electronics card 212 has coupled thereto a thermal transfer structure 215 such that an electronics card and thermal transfer structure subassembly 210 is defined. The electronics card 212 and subassembly 210 are shown exploded from a socket 113 of an electronic system comprising a plurality of parallel-disposed sockets 113 on a circuit board 112, such as described above in connection with FIGS. 1-6. In this embodiment, the coolant-cooled structure 201 includes two primary, parallel-disposed cold rails 220, 230, between which a plurality of secondary, low-profile cold rails 250 extend. As illustrated, secondary, low-profile cold rails 250 are attached to and in fluid communication with the primary, parallel-extending cold rails 220, 230 of the coolant-cooled structure 201. In one implementation, a first primary cold rail 220 comprises a coolant supply manifold, and a second primary cold rail 230 comprises a coolant return manifold. Coolant, such as water, is supplied via a coolant inlet 221 and one or more coolant inlet tubes 223 to the coolant supply manifold within first primary cold rail 220, and returned via coolant outlet tubes 233 and a coolant outlet 231 from the coolant return manifold within the second primary cold rail 230.

By way of example, the first primary cold rail 220 and second primary cold rail 230 each include a plurality of threaded openings 222, 232, respectively, in an upper surface thereof. These threaded openings facilitate attachment of respective electronics card and thermal transfer structure subassemblies 210 to the primary cold rails using, for instance, threaded fasteners which engage the threaded openings in the primary cold rails 220, 230.

The plurality of threaded openings 222, 232 in the upper surfaces of the first and second primary cold rails 220, 230 facilitate the parallel disposition of multiple electronics cards and thermal transfer structure subassemblies 210 in close proximity. In such a configuration, respective sockets (or connectors) 113 operatively receive a respective electronics card of the plurality of subassemblies. As described herein, in one embodiment, the electronics card 212 may comprise, for instance, a dual-in-line memory module (DIMM) card, which contains a plurality of electronic components to be cooled, such as dynamic random access memory (DRAM) chips and application-specific integrated circuit (ASIC) chips. Note that the electronic system may include one or more rows of electronics card sockets, and thus one or more rows of electronics card and thermal transfer structure subassemblies, such as discussed herein, with one row being shown in FIGS. 7A & 7B by way of example only.

Advantageously, the coolant-cooled structure configuration of FIGS. 7A & 7B provides additional liquid-cooled surface area for the thermal transfer structures to contact, and thereby enhances thermal conduction of heat from the electronics card. In this configuration, the thermal coupling at the side edges of the electronics card and thermal transfer structure subassembly to the two primary, parallel-extending cold rails is maintained, and additional or secondary, low-profile cold rails are provided to engage (in one embodiment) one or more lower portions, such as the bottom surfaces, of the thermal transfer structure(s). The secondary low-profile cold rails depicted in the embodiment of the FIGS. 7A & 7B advantageously reduces thermal gradients at the side edge thermal coupling to the primary cold rails by increasing the surface area available for heat transfer from the respective electronics card and thermal transfer structure subassemblies to the coolant-cooled structure comprising the primary and secondary cold rail assembly. By way of specific example, the coolant-cooled structure may include a primary coolant supply-side cold rail, n cold rails connected in parallel, wherein in one example, n=65, and another primary coolant-cooled cold rail on the return side. This direction of coolant flow is depicted by way of example in FIG. 7B. Further, in one example, the cold rail may be made of metal, such as cooper, and the electronics card and thermal transfer structure subassembly may be mechanically connected via threaded fasteners, such as bolts, to the threaded openings provided in the upper surfaces of the primary coolant-carrying cold rails. This configuration allows for easy removal and/or replacement of an electronics card, either at the factory or at a customer location, without requiring any disassembly of the coolant-cooled structure or any breaking of coolant connections.

In operation, liquid coolant enters the coolant supply manifold at the primary, supply-side cold rail. This primary cold rail provides two functions in this implementation, that is, it removes some of the heat generated by the electronics card assembly through the attached thermal transfer structure, and in particular, through the thermally conductive extensions extending from the one or more edges of the thermal spreader(s) of the thermal transfer structure, and serves as the supply manifold to the secondary, low-profile cold rails disposed in parallel between the two primary cold rails. In one example, there are n secondary low-profile cold rails connected in parallel, and it is these secondary cold rails where a majority of the heat is transferred from the electronics card and thermal transfer structure subassemblies to the coolant-cooled structure. Thermal transfer can be facilitated by attaching a compliant interface material on the upper surfaces of the secondary, low-profile cold rails. This compliant interface material would facilitate provision of a thermal transfer path from one or both of the front and back thermal spreaders of a thermal transfer structure, to one or two secondary, low-profile cold rails, as discussed herein.

Figure 8:
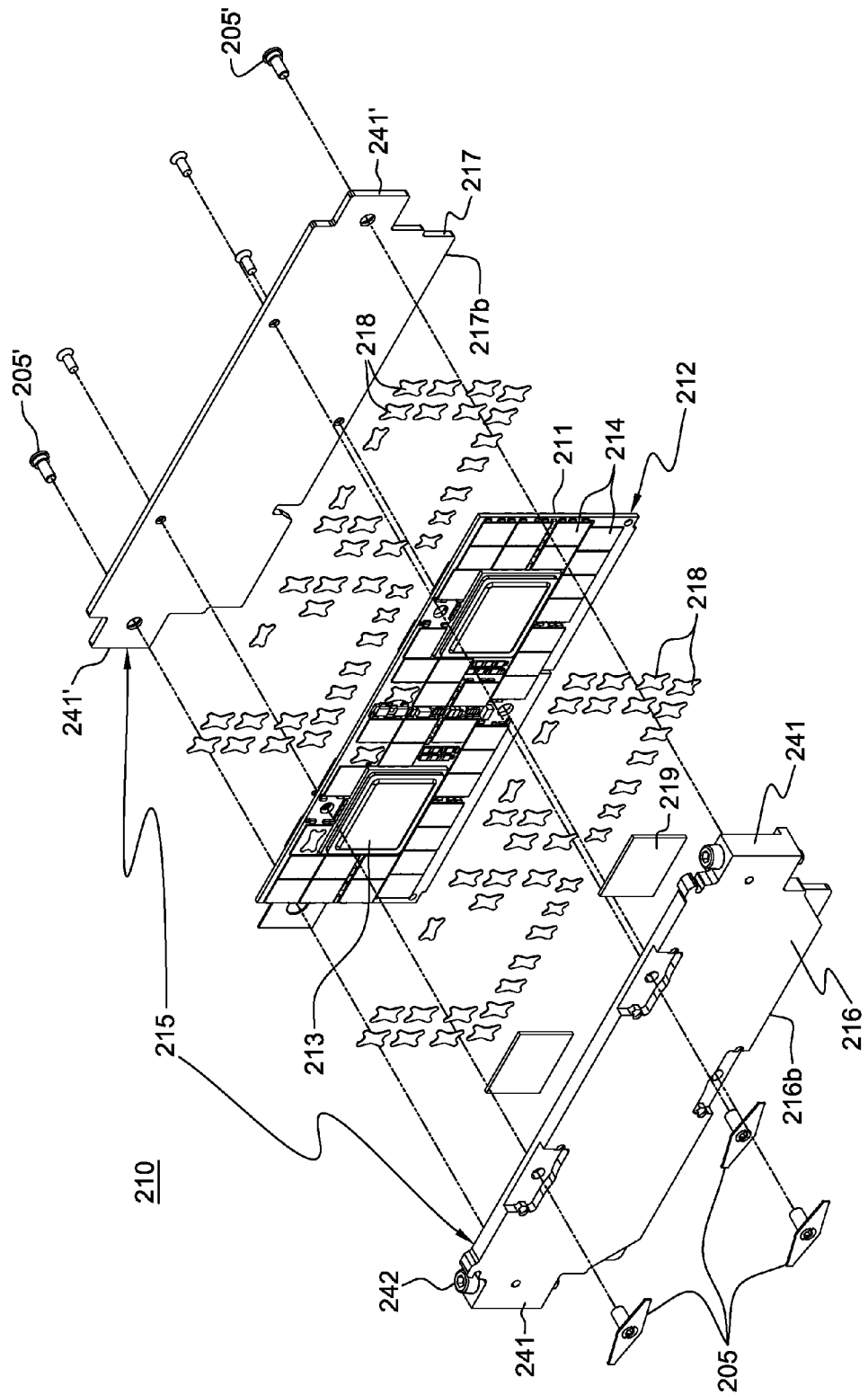
FIG. 8 is a partially exploded depiction of one embodiment of the electronics card and thermal transfer structure subassembly of FIG. 7A, in accordance with one or more aspects of the present invention.

FIG. 8 depicts one detailed embodiment of an electronics card and thermal transfer structure subassembly 210. In this embodiment, the electronics card 212 is shown to comprise a plurality of electronic components, such as memory controllers 213 and dynamic random access memories (DRAMs) 214, arrayed on opposite main surfaces or sides of a board or substrate 211 of electronics card 212. Thermal interface material 218 is shown disposed between the DRAMs 214 on a first side of the electronics card and a first thermal spreader 216, or between the DRAMs 214 on a second side of the electronics card and a second thermal spreader 217 of the thermal transfer structure. The first thermal spreader 216 and second thermal spreader 217 are sized and configured to sandwich electronics card 212 therebetween when coupled together, for instance, via spring-biased fasteners 205. Similarly, a memory controller thermal interface material 219 may be provided between memory controllers 213 and first thermal spreader 216. First thermal spreader 216 may include recesses (not shown) on a main surface thereof, which are sized and configured to accommodate the respective memory controller cards to ensure good thermal coupling between the first thermal spreader and the electronic components on the one side of electronics card 212, and thereby good thermal conduction between the adjoining surfaces. In one embodiment, the first heat spreader and second heat spreader are each fabricated of thermally conductive material, such as a thermally conductive metal material. By way of further example, first heat spreader 216 and second heat spreader 217 may be fabricated of copper or aluminum.

In the embodiment depicted, first thermal spreader 216 includes thermally conductive extensions 241 at the side edges thereof, and second thermal spreader 217 includes thermally conductive extensions 241' at the side edges thereof, which in this embodiment, are both shown integral with the respective thermal spreaders. The thermally conductive extensions 241, 241' are sized and configured to extend beyond the electronics card 212 when the electronics card 212 is sandwiched between the first and second thermal spreaders 216, 217 and the subassembly is coupled together via, for instance, spring-biased fasteners 205. Additionally, thermally conductive extensions 241' are sized to thermally couple to thermally conductive extensions 241 of first thermal spreader 216, and both may be mechanically affixed together by fasteners 205'. By so coupling the thermally conductive extensions, thermal conduction of heat is facilitated from the second thermal spreader to the first thermal spreader 216, which in the illustrated embodiment, is a larger heat spreader for accommodating a greater heat transfer.

The thermal transfer structure 215 further includes threaded fasteners 242 extending, in this example, through thermally conductive extensions 241 of first thermal spreader 216. These threaded fasteners facilitate coupling of the thermal transfer structure to the two primary cold rails at the side edges of the thermal spreader.

Thus, assuming that electronic components are also disposed on the second main side of the electronics card, and that these components need to be cooled, then the second thermal spreader, such as a second aluminum spreader, maybe included as part of the thermal transfer structure. The first and second thermal spreaders may be mechanically coupled together with the electronics card sandwiched therebetween using, for instance, threaded fasteners 205' at opposite edges thereof and, in the in embodiment of FIG. 8, multiple spring-loaded fasteners 205 in the middle of the plates, which apply a spring-biased force between the plates to minimize thermal interface resistance to the electronic components of the card on the opposite sides of the card. Heat generated by electronic components on the first side of the electronics card is directly transferred to the first thermal spreader, and heat transferred to the second thermal spreader may be spread to the thermal conductive extensions thereof, which in the embodiments of FIG. 8 are coupled to the extensions of the first heat spreader, and eventually to the liquid coolant passing through the primary or secondary cold rails.

FIGS. 9A & 9B depict the coolant-cooled electronic assembly of FIGS. 7A-8, with the electronics cards illustrated operatively inserted within respective sockets of the electronic system. Referring collectively to FIGS. 9A & 9B, the cooling apparatus cools the heat-generating electronic components of the electronics card by, at least in part, facilitating thermal conduction of heat from, for instance, first (or front) thermal spreader 216 to the upper surfaces of the primary coolant-cooled cold rails 220, 230 (via thermal interface material 227), within which the coolant supply manifold 225 and coolant return manifold 235 are disposed (in one embodiment). This heat transfer path is illustrated in the edge-side partial cross-sectional depiction of FIG. 9B as heat transfer path 300. As described above in connection with the embodiment of FIGS. 1-6, thermal interface material may be provided between the thermally conductive extensions 241 and 241', as well as between the lower surface of the thermally conductive extension 241 and the upper surfaces of the primary coolant-carrying cold rails 220, 230 to which the thermally conductive extensions 241 mechanically couple via, for instance, threaded fasteners 242, as explained above.

As illustrated, the electronics card and thermal transfer structure subassembly 210 is operatively disposed with the electronics card 212 docked in position within a socket 113 of the electronic system. In this embodiment, two adjacent secondary, low-profile cold rails 250 are illustrated, each with multiple coolant-carrying channels 251 extending therethrough. These coolant-carrying channels 251 are in fluid communication with the coolant supply manifold 225 of the primary supply side cold rail 220 and the coolant return manifold 235 of the primary return side cold rail 230. In this embodiment, thermal interface material pads 252 are disposed on the top surface of the secondary, low-profile cold rails 250. These thermal interface material pads, which may include one or more of the above-discussed thermal interface materials, are disposed along the upper surface of the adjacent secondary, low-profile cold rails 250 to facilitate good thermal contact and thus good thermal conduction 301 from first thermal spreader 216 into one secondary, low-profile cold rail 250 on one side of the socket, and from second thermal spreader 217 into another secondary, low-profile cold rail 250 on the opposite side of the elongate socket 113. Note that in this configuration, since the first thermal spreader 216 is wider than the second thermal spreader 217 (by way of example only), then the first thermal spreader bottom surface 216b has a larger contact surface area to the one secondary, low-profile cold rail 220 on the one side of the socket than the second thermal spreader bottom surface 217b on the other side of the socket makes to the other secondary, low-profile cold rail 250. Again, the particular configuration of FIGS. 7A-9B is presented by way of example only, and not by way of limitation.

As noted, in one embodiment, the secondary, low-profile cold rails may provide the surface area where the majority of heat is transferred from the electronics card and thermal transfer structure subassembly into the coolant-cooled structure, i.e., the primary and secondary cold rail assembly. As also noted, this can be facilitated by attaching a compliant interface material to the top surface of the secondary, low-profile cold rails to facilitate providing a thermal path from both the first (or front) side thermal spreader and the second (or back) thermal spreader, to two adjacent secondary, low-profile cold rails on either side of the socket to which the electronics card operatively docks. When the electronics card and thermal transfer structure subassembly is electrically, operationally docked or connected via a socket or connector, the first, front thermal spreader connects to one secondary, low-profile cold rail with a pad thermal interface (TIM) to facilitate transfer of heat, and at the same time, thermal coupling with the primary coolant-carrying cold rails is achieved via the thermally conductive extensions (in this example) coupling to the upper surfaces of the primary cold rails. Further, if a second, back thermal spreader is employed as part of the thermal transfer structure, then that spreader also makes thermal connection with another secondary, low-profile cold rail, as depicted by way of example in FIGS. 9A & 9B.

Those skilled in the art will note that the plurality of secondary, low-profile cold rails disclosed herein may be mounted to or in thermal contact with the circuit board of the electronic system, and in so doing, further facilitate cooling of the circuit board itself, that is, in addition to the electronic components (such as DIMM cards) to be cooled. This is particularly advantageous in an implementation where air-cooling of the printed circuit board may be insufficient to remove the required amount of heat.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to explain the principles of the invention and the practical application, and to enable others of ordinary skill in the art to understand the invention through various embodiments and the various modifications thereto which are dependent on the particular use contemplated.

What is claimed is:

1. A cooling apparatus comprising:
    a thermal transfer structure coupled to at least one side of an electronics card comprising one or more electronic components to be cooled, the electronics card operatively docking within a socket of an electronic system, and the thermal transfer structure comprising:
        a thermal spreader coupled to the one side of the electronics card; and
    a coolant-cooled structure disposed adjacent to the socket of the electronic system within which the electronics card is to operatively dock, the coolant-cooled structure comprising:
        at least one low-profile cold rail sized and configured to thermally couple to the thermal spreader along a bottom edge of the thermal spreader with operative docking of the electronics card within the socket; and
        at least one coolant-carrying channel associated with the at least one low-profile cold rail for removing heat from the at least one low-profile cold rail to coolant flowing through the at least one coolant-carrying channel; and
    a first edge-side cold rail and a second edge-side cold rail, the first edge-side cold rail and the second edge-side cold rail being sized and configured to thermally couple to opposite side edges of the thermal spreader with operative docking of the electronics card within the socket.

2. The cooling apparatus of claim 1, wherein the first edge-side cold rail comprises a coolant supply manifold, and the second edge-side cold rail comprises a coolant return manifold, and wherein the coolant supply manifold of the first edge-side cold rail and coolant return manifold of the second edge-side cold rail are in fluid communication with the at least one coolant-carrying channel associated with the at least one low-profile cold rail to facilitate flow of coolant through the at least one coolant-carrying channel.

3. The cooling apparatus of claim 2, wherein the coolant-cooled structure comprises a plurality of low-profile cold rails disposed in parallel between the first edge-side cold rail and the second edge-side cold rail, and a plurality of coolant-carrying channels associated with the plurality of low-profile cold rails disposed in parallel between the first edge-side cold rail and the second edge-side cold rail, each coolant-carrying channel being associated with a respective low-profile cold rail of the plurality of low-profile cold rails for removing heat therefrom, and the at least one low-profile cold rail being at least one low-profile cold rail of the plurality of low-profile cold rails, and the at least one coolant-carrying channel being at least one coolant-carrying channel of the plurality of coolant-carrying channels.

4. The cooling apparatus of claim 3, wherein the socket is disposed between two adjacent, low-profile cold rails of the plurality of low-profile cold rails disposed in parallel between the first edge-side cold rail and the second edge-side cold rail.

5. The cooling apparatus of claim 3, wherein the electronics card is a first electronics card, the socket is a first socket, the thermal transfer structure is a first thermal transfer structure, and the thermal spreader thereof is a first thermal spreader, and wherein the cooling apparatus further comprises a second thermal transfer structure coupled to at least one side of a second electronics card comprising one or more additional electronic components to be cooled, the second electronics card operatively docking within a second socket of the electronic system, wherein the first and second sockets are adjacent sockets in the electronic system and the second thermal transfer structure comprises a second thermal spreader, the first thermal spreader of the first thermal transfer structure thermally coupling to the one low-profile cold rail of the plurality of low-profile cold rails, and the second thermal spreader of the second thermal transfer structure also thermally coupling to the one low-profile cold rail of the plurality of low-profile cold rails when the first electronics card and second electronics card are operatively docked within the adjacent first and second sockets of the electronic system.

6. The cooling apparatus of claim 3, wherein the thermal spreader comprises a front thermal spreader, and wherein the thermal transfer structure further comprises a back thermal spreader, the front thermal spreader and the back thermal spreader being coupled to opposite main sides of the electronics card, and each comprises at least one thermally conductive extension extending past the electronics card when the front and back thermal spreaders are coupled together with the electronics card sandwiched between the front and back thermal spreaders, the thermally conductive extensions thermally coupling together to facilitate thermal conduction of heat from the back thermal spreader to the front thermal spreader, and wherein the front thermally spreader thermally couples along a bottom edge thereof to the one low-profile cold rail and the second thermal spreader thermally couples along a bottom edge thereof to another low-profile cold rail, wherein the one low-profile cold rail and the another low-profile cold rail are disposed on opposite sides of the socket.

7. The cooling apparatus of claim 2, wherein the thermal transfer structure mechanically couples to the first and second edge-side cold rails with operative docking of the electronics card within the socket.

8. The cooling apparatus of claim 2, further comprising a compliant, thermal interface material disposed between the thermal spreader and the one low-profile cold rail of the at least one low-profile cold rail with operative docking of the electronics card within the socket.

9. The cooling apparatus of claim 2, wherein the electronics card comprises one of an in-line memory module or a dual-in-line memory module.

10. A coolant-cooled electronic assembly comprising:
an electronic system, the electronic system comprising:
    an electronics card comprising one or more electronic components to be cooled;
    a socket operatively receiving the electronics card; and
a cooling apparatus comprising:
    a thermal transfer structure coupled to at least one side of the electronics card comprising one or more electronic components to be cooled, the thermal transfer structure comprising:
        a thermal spreader coupled to the one side of the electronics card; and
    a coolant-cooled structure disposed adjacent to the socket of the electronic system within which the electronics card is operatively docked, the coolant-cooled structure comprising:
        a least one low-profile cold rail sized and configured to thermally couple to the thermal spreader along a bottom edge of the thermal spreader with operative docking of the electronics card within the socket;
        at least one coolant-carrying channel associated with the at least one low-profile cold rail for removing heat from the at least one low-profile cold rail to coolant flowing through the at least one coolant-carrying channel; and
        a first edge-side cold rail and a second edge-side cold rail, the first edge-side cold rail and the second edge-side cold rail being thermally coupled to opposite side edges of the thermal spreader with operative docking of the electronics card within the socket.

11. The coolant-cooled electronic assembly of claim 10, wherein the first edge-side cold rail comprises a coolant supply manifold, and the second edge-side cold rail comprises a coolant return manifold, and wherein the coolant supply manifold of the first edge-side cold rail and coolant return manifold of the second edge-side cold rail are in fluid communication with the at least one coolant-carrying channel associated with the at least one low-profile cold rail to facilitate flow of coolant through the at least one coolant-carrying channel.

12. The coolant-cooled electronic assembly of claim 11, wherein the coolant-cooled structure comprises a plurality of low-profile cold rails disposed in parallel between the first edge-side cold rail and the second edge-side cold rail, and a plurality of coolant-carrying channels associated with the plurality of low-profile cold rails disposed in parallel between the first edge-side cold rail and the second edge-side cold rail, each coolant-carrying channel being associated with a respective low-profile cold rail of the plurality of low-profile cold rails for removing heat therefrom, and the at least one low-profile cold rail being at least one low-profile cold rail of the plurality of low-profile cold rails, and the at least one coolant-carrying channel being at least one coolant-carrying channel of the plurality of coolant-carrying channels.

13. The coolant-cooled electronic assembly of claim 12, wherein the socket is disposed between two adjacent, low-profile cold rails of the plurality of low-profile cold rails disposed in parallel between the first edge-side cold rail and the second edge-side cold rail.

14. The coolant-cooled electronic assembly of claim 12, wherein the electronics card is a first electronics card, the socket is a first socket, the thermal transfer structure is a first thermal transfer structure, and the thermal spreader thereof is a first thermal spreader, and wherein the cooling apparatus further comprises a second thermal transfer structure coupled to at least one side of a second electronics card comprising one or more additional electronic components to be cooled, the second electronics card operatively docking within a second socket of the electronic system, wherein the first and second sockets are adjacent sockets in the electronic system and the second thermal transfer structure comprises a second thermal spreader, the first thermal spreader of the first thermal transfer structure thermally coupling to the one low-profile cold rail of the plurality of low-profile cold rails, and the second thermal spreader of the second thermal transfer structure also thermally coupling to the one low-profile cold rail of the plurality of low-profile cold rails when the first electronics card and second electronics card are operatively docked within the adjacent first and second sockets of the electronic system.

15. The coolant-cooled electronic assembly of claim 12, wherein the thermal spreader comprises a front thermal spreader, and wherein the thermal transfer structure further comprises a back thermal spreader, the front thermal spreader and the back thermal spreader being coupled to opposite main sides of the electronics card, and each comprises at least one thermally conductive extension extending past the electronics card when the front and back thermal spreaders are coupled together with the electronics card sandwiched between the front and back thermal spreaders, the thermally conductive extensions thermally coupling together to facilitate thermal conduction of heat from the back thermal spreader to the front thermal spreader, and wherein the front thermally spreader thermally couples along a bottom edge thereof to the one low-profile cold rail and the second thermal spreader thermally couples along a bottom edge thereof to another low-profile cold rail, wherein the one low-profile cold rail and the another low-profile cold rail are disposed on opposite sides of the socket.

* * * * *